(12) United States Patent
Tanabe et al.

(10) Patent No.: US 7,049,676 B2
(45) Date of Patent: May 23, 2006

(54) SEMICONDUCTOR DEVICE HAVING A SHIELDING LAYER

(75) Inventors: Shinji Tanabe, Tokyo (JP); Tuguto Maruko, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/753,081

(22) Filed: Jan. 8, 2004

(65) Prior Publication Data

US 2004/0222487 A1   Nov. 11, 2004

(30) Foreign Application Priority Data

Jan. 8, 2003   (JP) .............................. 2003-002476

(51) Int. Cl.
  *H01L 29/00* (2006.01)
  *H01L 29/82* (2006.01)
  *H01L 43/00* (2006.01)
  *H01L 29/76* (2006.01)
  *H01L 9/94* (2006.01)
(52) U.S. Cl. ........................ 257/508; 257/409; 257/422
(58) Field of Classification Search ................ 257/409, 257/508, 528, 531, 532
See application file for complete search history.

(56) References Cited

U.S. PATENT DOCUMENTS

| 5,288,661 A * | 2/1994 | Satoh et al. ................. 438/449 |
| 6,489,656 B1 * | 12/2002 | Lin ............................. 257/359 |
| 6,501,169 B1 | 12/2002 | Aoki et al. |
| 6,545,354 B1 | 4/2003 | Aoki et al. |
| 6,603,165 B1 * | 8/2003 | Yamauchi et al. .......... 257/296 |
| 6,873,053 B1 * | 3/2005 | Hino et al. ................. 257/774 |
| 2001/0020731 A1 * | 9/2001 | Takamura ................... 257/621 |
| 2001/0045616 A1 * | 11/2001 | Yoshitomi ................... 257/531 |
| 2003/0127704 A1 * | 7/2003 | Kobayashi et al. .......... 257/531 |
| 2004/0004255 A1 * | 1/2004 | Yoshimura ................... 257/379 |

FOREIGN PATENT DOCUMENTS

| JP | 4-30730 | 3/1992 |
| JP | 04-174543 | 6/1992 |
| JP | 04-179233 | 6/1992 |
| JP | 8-78626 | 3/1996 |
| JP | 2000-235979 | 8/2000 |

* cited by examiner

Primary Examiner—Kenneth Parker
Assistant Examiner—Jesse Fenty
(74) Attorney, Agent, or Firm—Volentine Francos & Whitt, PLLC

(57) ABSTRACT

The semiconductor device includes a multilevel interconnection formed on a semiconductor substrate. The multilevel interconnection includes a plurality of wiring layers each of which is insulated by an insulating layer. A metal member is formed as a shielding film in a same plane as a wiring layer. As a result, the shielding layer can be formed without increasing the number of process steps.

7 Claims, 8 Drawing Sheets

SEMICONDUCTOR DEVICE HAVING A SHIELDING LAYER

CROSS REFERENCE TO RELATED APPLICATION

A claim of priority under 35 U.S.C. §119 is made to Japanese Patent Application No. 2003-002476, filed Jan. 8, 2003, which is herein incorporated by reference in its entirety for all purposes.

BACKGROUND OF THE INVENTION

1. Field of the Invention

The present invention relates to a semiconductor device having a shielding layer.

2. Description of the Related Art

A semiconductor device package called a Chip Size Package (hereinafter, called CSP) is similar in size to a semiconductor chip. A type of CSP is called a wafer level chip size package (Wafer Level Chip Size Package: WCSP) or wafer level chip scale package (Wafer Level Chip Scale Package: WCSP).

The conventional WCSP type semiconductor device has electrode pads formed on a semiconductor chip and an insulating layer formed on the semiconductor chip. The insulating layer has openings and the electrode pads are exposed through the openings. The WCSP also has external terminals formed on the insulating layer and redistribution wirings formed on the insulating layer. One end of the redistribution wirings is connected to the electrode pads via the openings and the other end of the redistributions is connected to the external terminals.

The semiconductor chip of the WCSP includes a semiconductor substrate and a circuit element. The circuit element includes electric elements formed on the semiconductor substrate and a multilevel interconnections.

The insulating layer and the redistribution wirings are sealed by a sealing resin. The external terminals is exposed from the sealing resin.

In the fabrication of the WCSP type semiconductor device, each of semiconductor devices is separated or diced after the sealing resin is formed on the wafer.

In the conventional WCSP type semiconductor device, the insulating layer that is formed between the redistribution wirings and the electric circuit is very thin. Therefore, the circuit element might be affected by a noise from the redistribution wirings. If the semiconductor device has a capacitor or an analog circuit, a capacitance value or a waveform characteristic in the analog circuit might be changed in response to the noise.

A semiconductor device that has an improved noise shielding feature has been described in Japanese Patent Laid-Open No. 2000-235979. The semiconductor device disclosed in this reference has a ground layer which is formed between the semiconductor chip and the redistribution wirings.

However, an additional process for forming the ground layer is needed in the semiconductor device disclosed in the reference. Also, the ground layer increases a thickness of the semiconductor device.

SUMMARY OF THE INVENTION

Accordingly, in one aspect of the present invention, a semiconductor device having a shielding layer is provided. The semiconductor device includes a multilevel interconnection formed on the semiconductor substrate. The multilevel interconnection includes a plurality of wiring layers each of which is insulated by an insulating layer. A metal member is formed as a shielding layer in a same plane as a wiring layer. As a result, the shielding layer can be formed without increasing the number of process steps.

DETAILED DESCRIPTION OF THE PREFERRED EMBODIMENTS

Figure 1:
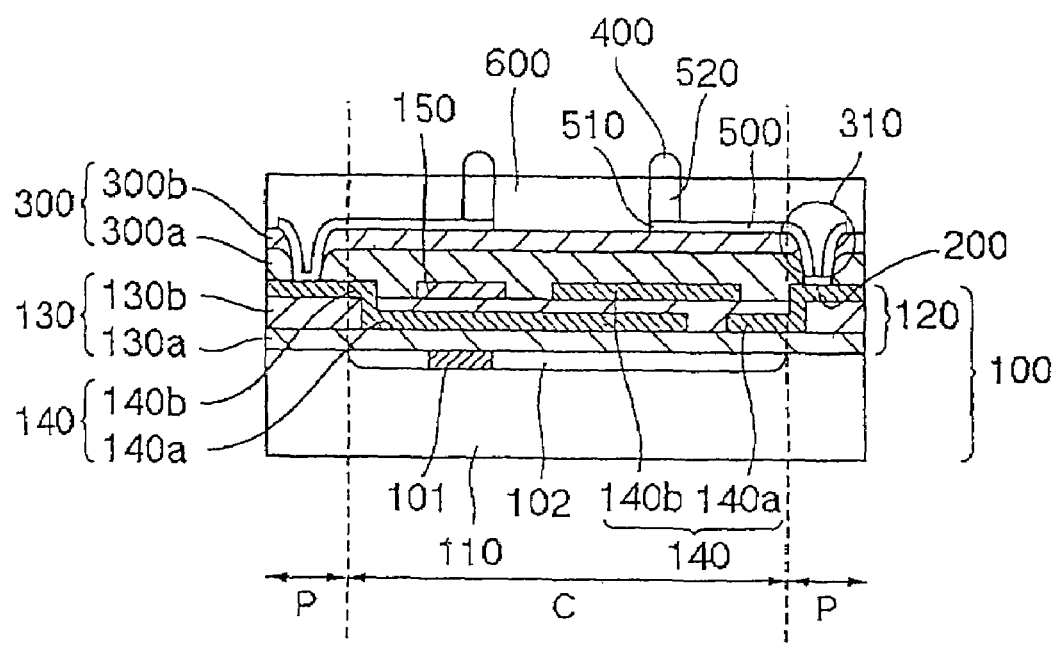
FIG. 1 is a cross-sectional view showing a semiconductor device of a first embodiment of the present invention.

Semiconductor devices according to preferred embodiments of the present invention will be explained hereinafter with reference to the accompanying figures. In order to simplify the explanation, like elements are given like or corresponding reference numerals. Dual explanations of the same elements are avoided.

First Preferred Embodiment

Figure 2:
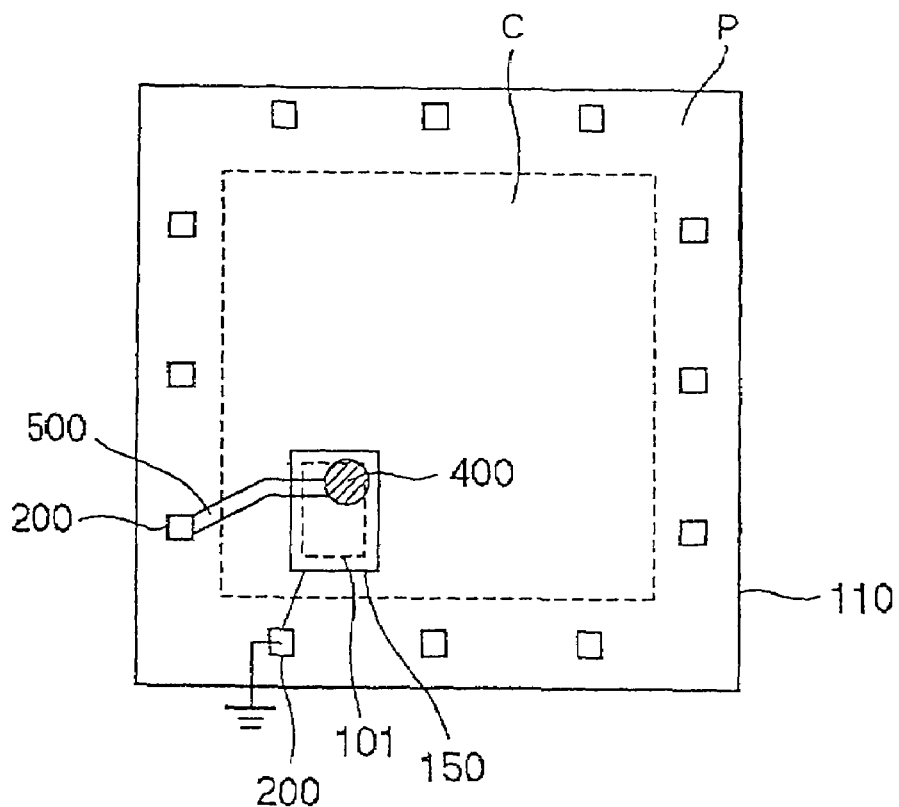
FIG. 2 is a plane view showing the semiconductor device of the first embodiment of the present invention.

FIG. 1 is a cross-sectional view showing a semiconductor device according to a first embodiment of the present invention. FIG. 2 is a plane view of the semiconductor device which shows a relationship between a position of a capacitor and a portion of a metal member.

The semiconductor device includes a semiconductor chip 100, a plurality of electrode pads 200 on the semiconductor chip, an insulating layer 300 which has a plurality of openings 310 for exposing the electrode pads, a plurality of external terminals 400 formed on the insulating layer 300, and redistribution wirings 500 formed on the insulating layer 300. One end of the redistribution wirings 500 is connected to the electrode pads 200 via corresponding openings 310. The other end of the redistribution wirings 500 is connected to the external terminal 400.

The semiconductor chip 100 includes a semiconductor substrate 110, a plurality of electronic elements 102 formed on the semiconductor substrate 110, and a multilevel interconnection 120 formed on the electronic element 102. The electronic elements 102 include a capacitor 101.

The capacitor forms a part of a high frequency circuit such as a voltage controlled oscillator. A range of the high frequency of this embodiment is 300 MHz or more.

The semiconductor substrate 110 has a central area C and a peripheral area P as shown in FIG. 1 and FIG. 2. The multilevel interconnection 120 has a plurality of wiring layers each of which is isolated by interlayer insulating layers 130. Wirings 140 are formed in the wiring layers located between the interlayer insulating layers 130. The multilevel interconnection 120 connects the electronic element 102 to the electrode pads 200. The multilevel interconnection 120 and the electronic elements 102 form an electronic circuit.

In this embodiment, the multilevel interconnection 120 includes two wiring layers. That is, the multilevel interconnection 120 includes an interlayer insulating layer 130a formed on the semiconductor substrate 110, wirings 140a formed on the insulating layer 130a, an interlayer insulating layer 130b formed on the wirings 140a and the interlayer insulating layer 130a, and wirings 140b formed on the interlayer wiring layer 130b. The interlayer insulating layers 130a and 130b are made of silicon dioxide, and the wirings 140a and 140b are made of aluminum, copper or tungsten.

A metal member 150 is formed on the interlayer insulating layer 130b. That is, the metal member 150 is formed in the same layer as that in which is the top wirings 140b are formed.

If the metal member 150 and the wirings 140b are formed of the same material, the metal member 150 and the wirings 140b can be formed simultaneously. As a result, process steps for fabricating the semiconductor device can be reduced.

The metal member 150 is located above the capacitor 101 so that the metal member 150 covers the entire capacitor 101 as shown in FIG. 2. The redistribution wirings 500 or the external terminals 400 which are applied the high frequency signal are formed above the metal member 150. The metal member 150 shields the capacitor 101 from noise generated by the redistribution wirings 500 or the external terminals 400. Further, the metal member 150 is connected to an electrode pad 200 which is applied with a ground voltage.

The electrode pads 200 are formed in the peripheral area of the semiconductor substrate 110 and the external terminals 400 are formed in the central area of the semiconductor substrate 110. An insulating layer 300 includes an insulating layer 300a such as silicon nitride or silicon dioxide and an insulating layer 300b such as polyimide formed on the insulating layer 300. The insulating layer 300a functions to protect the wirings 140b and the metal member 150 from being oxidized. The insulating layer 300b functions to protect the semiconductor chip from impact.

The external terminals 400 are made of solder and have a hemispherical configuration. Post electrodes 520 can be used for connecting the external terminals 400 to the redistribution wirings 500. The post electrodes 520 such as copper are formed on an end portion 510 of the redistribution wirings 500. The external terminals 400 are formed on the post electrode 520.

Figure 3:
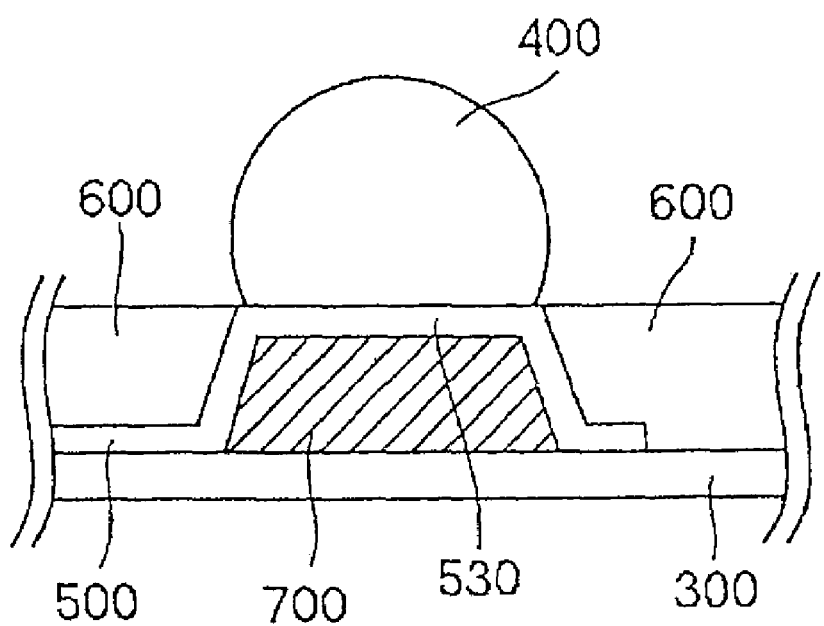
FIG. 3 is a cross-sectional view showing a part of the semiconductor of the first embodiment of the present invention.

In the alternative, the external terminals 400 can be connected to the redistribution wiring 500 using a support material 700 as shown in FIG. 3. The support material 700 such as resin is formed on the insulating layer 300. The redistribution wiring 500 is extended on a top surface of the support material 700. As a result, the end of the redistribution wiring 500 is curved. The external terminal 400 is formed on a top surface 530 of the redistribution wiring 500.

The external terminals 400 can be set in a desired location using the redistribution wiring 500. In this embodiment, the external terminals 400 are shifted from the peripheral area to the central area using the redistribution wirings 500.

A sealing resin 600 such as epoxy resin is formed on the insulating layer 300 and the redistribution wirings 500. A top surface of the post electrodes 520 is exposed from the sealing resin 600 and the sealing resin seals a side surface of the post electrodes 520. The redistribution wirings 500 and the post electrodes 520 are protected from impact by the sealing resin 600.

The capacitor 101 is a part of the electronic circuit. For example, the capacitor may be used to determine an oscillation frequency of the VCO. A voltage swing in the external terminals 400 or the redistribution wirings 500 generates the noise. In the conventional semiconductor device, a capacitance value in the capacitor might be changed by the electromagnetic induction which is caused by the noise. The telecommunication device is operated by high frequency. Therefore, a communication characteristic of the semiconductor device is easily changed by the noise.

However, the semiconductor device in this embodiment has the metal member 150 which is formed between the capacitor 101 and the redistribution wirings 500, thereby shielding noise which is generated in the redistribution wirings 500 or the external electrodes 400. As a result, an influence of the noise on the capacitor 101 is reduced.

Further, the metal member 150 is formed in the same layer as the wirings 140b is formed. Therefore, process steps for fabricating the semiconductor device are not increased as compared to the fabrication of the conventional device. Also, the thickness of the semiconductor device is not increased.

Second Preferred Embodiment

Figure 4:
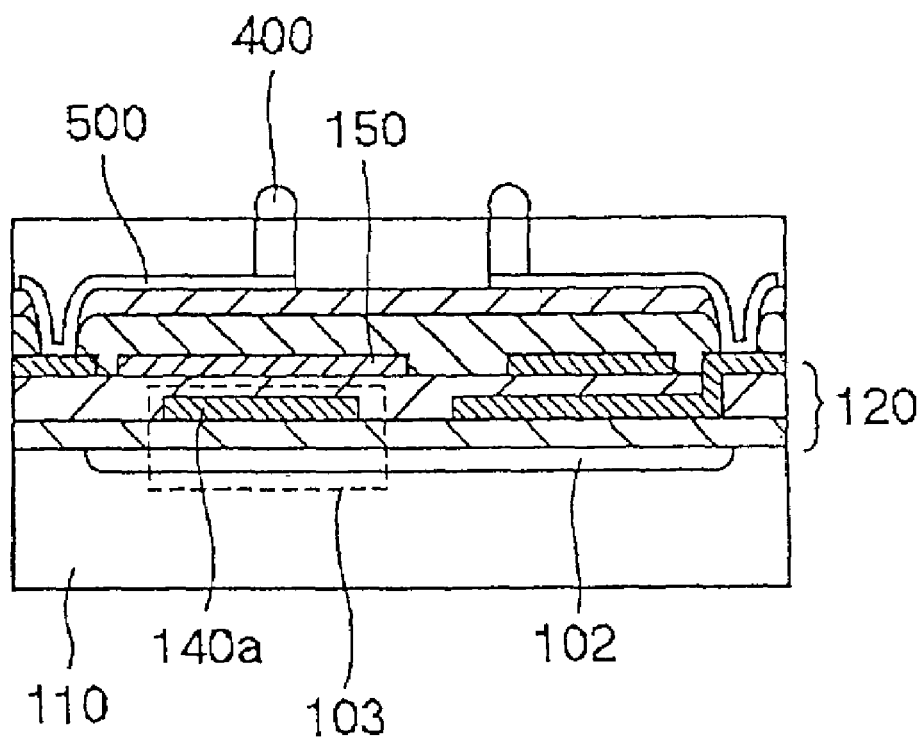
FIG. 4 is a cross-sectional view showing a semiconductor device of a second embodiment of the present invention.
Figure 5:
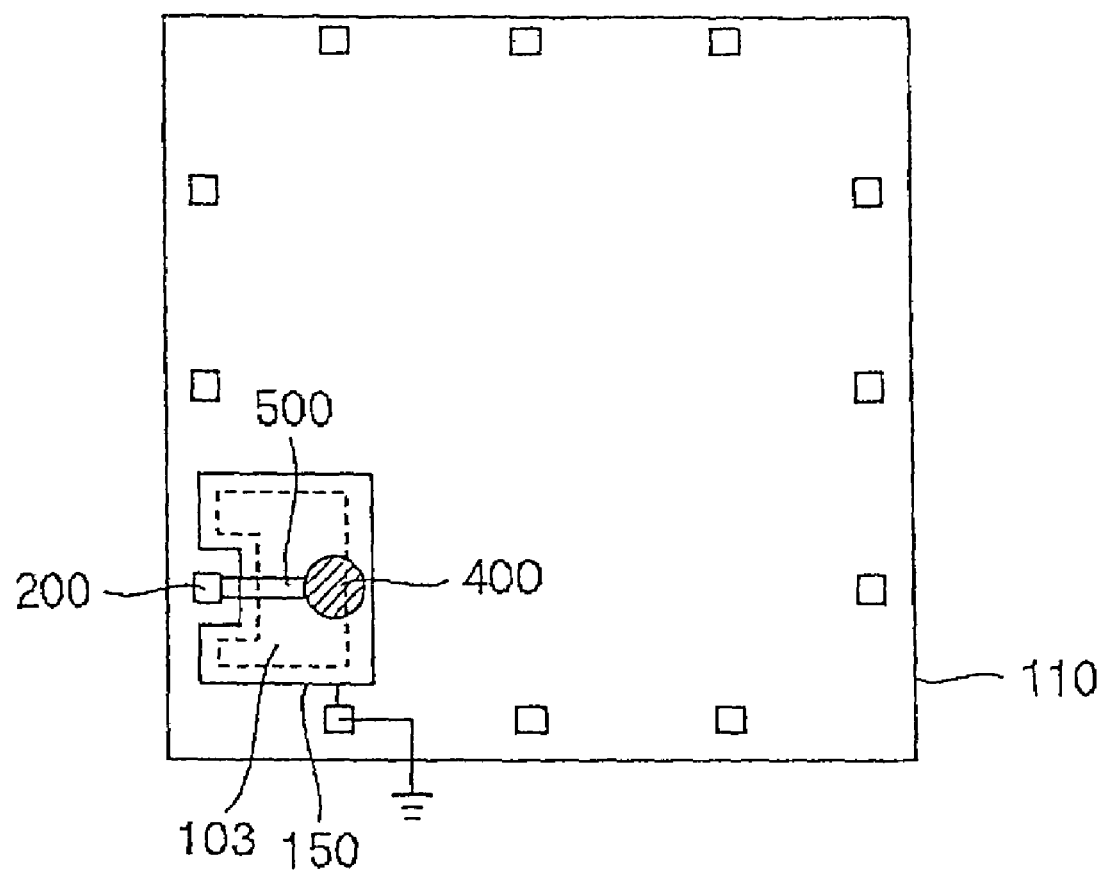
FIG. 5 is a plane view showing the semiconductor device in the second embodiment of the present invention.
Figure 6:
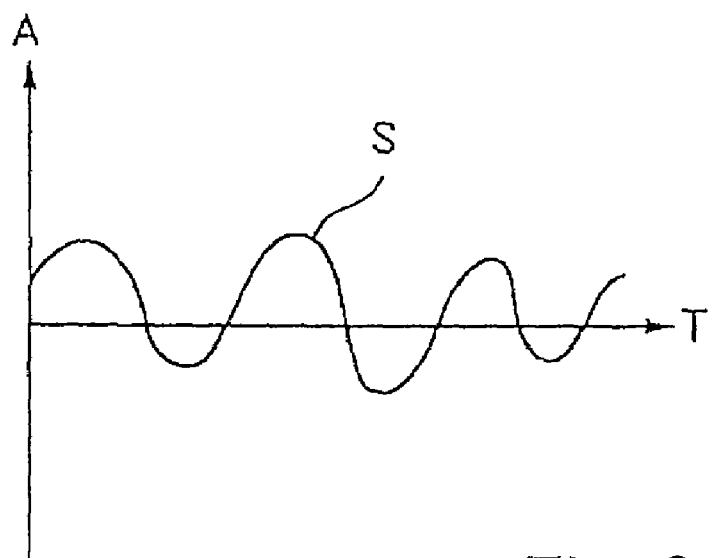
FIG. 6 is a waveform diagram showing an analog signal in the second embodiment of the present invention.

FIG. 4 is a cross-sectional view showing a semiconductor device of a second embodiment of the present invention. FIG. 5 is a plane view showing the semiconductor device in the second embodiment of the present invention. FIG. 6 is a waveform diagram showing an analog signal in the second embodiment of the present invention.

In this embodiment, the analog circuit 103 is operated by an analog signal such as shown in FIG. 6. In FIG. 6, a horizontal axis denotes a time T, a vertical axis denotes amplitude A, and reference sign S shows the analog signal. In the telecommunication device, the analog signal is used in an operational amplifier, a comparator, an RF transmitter, an RF receiver and an RF synthesizer. In a conventional semiconductor device, the noise which is generated in the redistribution wirings 500 or the external electrodes 400 might affect the analog circuit 103. That is, an electrostatic induction is generated in the analog circuit 103 causing noise. The electrostatic induction changes the analog signal.

In this embodiment, the electronic element 102 formed on the semiconductor substrate 101 and the multilevel interconnection 120 forms the electric circuit. The electric circuit includes the analog circuit 103.

Further, the metal member 150 is located above the analog circuit 103. The metal member 150 shields the analog circuit 103 from noise which is generated in the redistribution wirings 500 or the external terminals 400. In this embodiment, an entire area of the analog circuit is overlapped by the metal member 150.

Accordingly, the metal member 150 is formed between the analog circuit 103 and the redistribution wirings 500 and is applied the ground voltage, and the noise which is generated in the wirings or the external terminals 400 is shielded by the metal member 150.

The embodiment can be used in the telecommunication device. If the embodiment is used in the telecommunication device, noise related changes in the telecommunication character are reduced.

Third Preferred Embodiment

Figure 7:
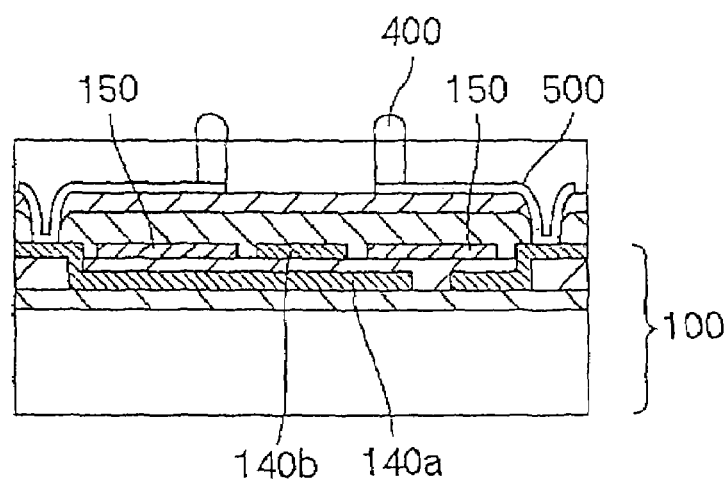
FIG. 7 is a cross-sectional view showing a semiconductor device of a third embodiment of the present invention.
Figure 8:
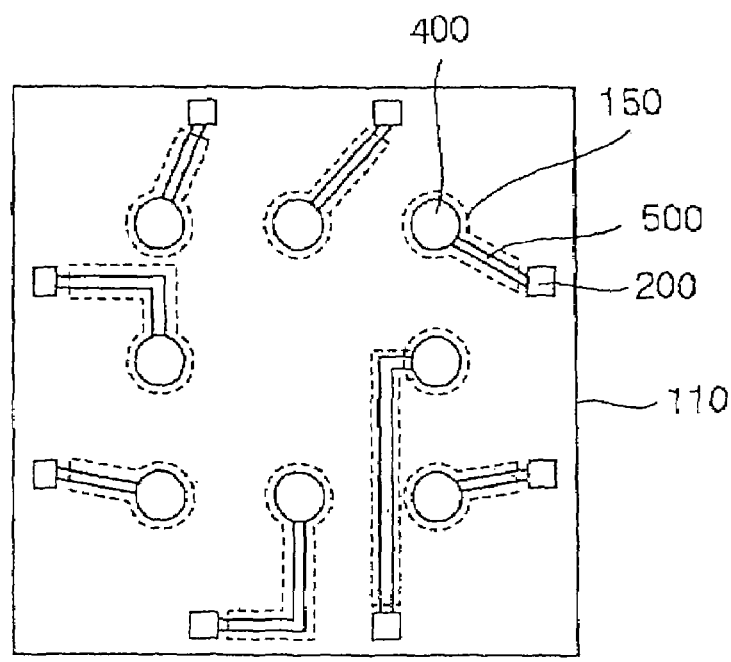
FIG. 8 is a plane view showing the semiconductor device of the third embodiment of the present invention.

FIG. 7 is a cross-sectional view showing a semiconductor device of a third embodiment of the present invention. FIG. 8 is a plane view showing the semiconductor device of the third embodiment of the present invention.

In this embodiment, an arrangement of the metal member 150 is different from the device which is described in the first preferred embodiment. The metal member 150 has a similar shape to the redistribution wiring 500 and the external terminal 400. The metal member 150 is formed under the entire area in which the redistribution wiring 500 and the external terminal 400 are formed. Therefore, the electronic circuit in the semiconductor chip 100 is shielded from noise which is generated in the redistribution wirings 500 and the external electrodes 400.

Accordingly, the metal member 150 is formed under the redistribution wirings 500 and is applied with a ground voltage, and noise which is generated in the wirings or the external terminals 400 is shielded by the metal member 150.

The embodiment can be used in a telecommunication device. If the embodiment is used in a telecommunication device, noise related in changes the telecommunication characteristics are reduced.

Fourth Preferred Embodiment

A method of fabricating the semiconductor device relating the first to third preferred embodiments is disclosed as the fourth preferred embodiment. The process steps are illustrated in FIG. 9 to FIG. 14. FIG. 15 is a plane view for explaining a part of an process step.

Figure 9:
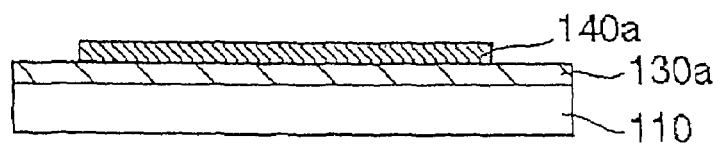
FIG. 9 to FIG. 14 are cross-sectional views showing fabricating steps for a semiconductor device of the fourth embodiment of the present invention.
Figure 10:
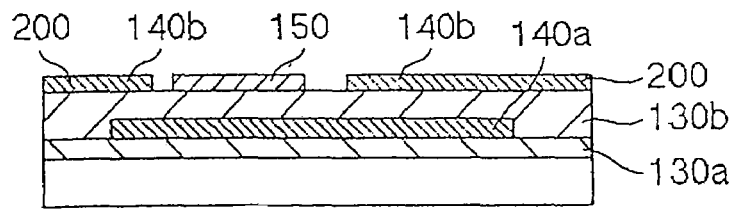

First, the electronic element such as the capacitor is formed on the semiconductor substrate. Then, the insulating layer 130a is formed on the semiconductor substrate 110 and the wirings 140a are formed on the interlayer insulating layer 130a as shown in FIG. 9. Then, the wirings 140b and the metal member 150 are formed on the interlayer insulating layer 130b, as shown in FIG. 10.

The wirings 140a, the wirings 140b and the metal member 150 are made of conductive material such as aluminum or tungsten. The wirings 140b are formed by a sputtering technique. In this embodiment, the wirings 140b and the metal member 150 are made simultaneously. That is, after a layer which is made of aluminum or tungsten is formed on the interlayer insulating layer 130b, the wirings 140b and the metal member 150 are patterned using a photolithography etching technique. The metal member 150 is connected to the ground electrode 200 as shown in FIG. 15.

Figure 11:
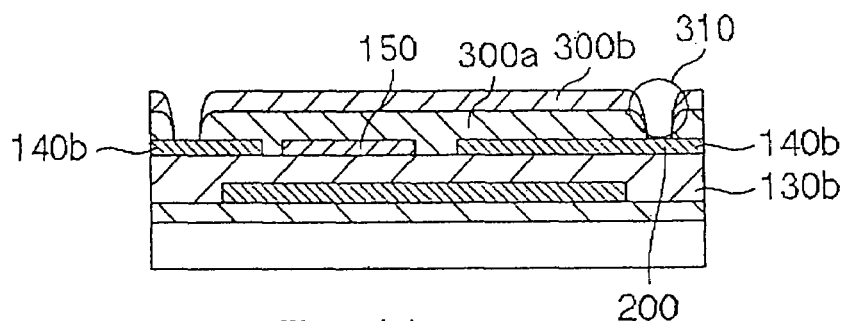

Next, the insulating layer 300a such as silicon nitride is formed on the wirings 140b, the metal member 150 and the insulating layer 130b as shown in FIG. 11. The insulating layer 300a such as silicon nitride is formed by a chemical vapor deposition technique. Further, the insulating layer 300b such as polyimide is formed on the insulating layer 300a. The insulating layer 300b such as polyimide is formed by a sputtering technique. The openings 310 are formed in the insulating layer 300a and the insulating layer 300b by using a photolithography etching technique and the top surface of the electrode pads 200 is exposed from the openings 310.

Figure 12:
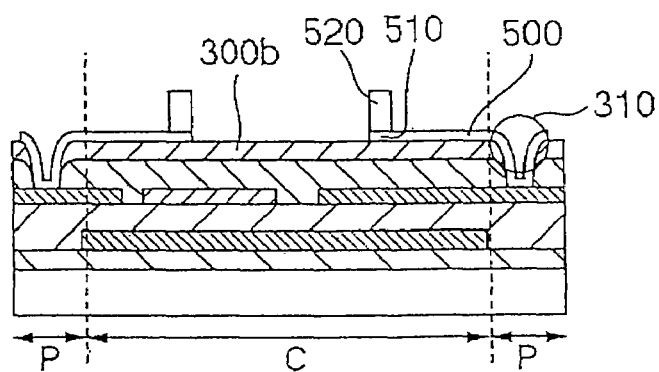

Next, the redistribution wirings 500 are formed on the insulating layer 300b as shown in FIG. 12. The redistribution wirings 500 extend from the electrode pad 200 to the central portion of the semiconductor substrate 110. The redistribution wirings 500 are formed of copper and formed by an electrolytic plating technique. Further, the post electrodes 520 are formed on the end portion 510 of the redistribution wirings 500. The post electrodes 520 are formed of copper by an electrolytic plating technique.

Figure 13:
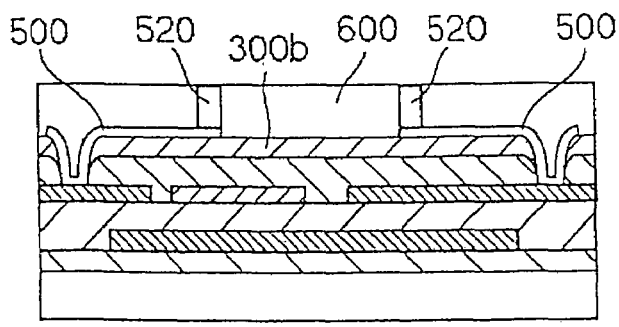

Next, the sealing layer 600 such as epoxy resin is formed on the insulating layer 300b and the redistribution wirings 500 as shown in FIG. 13. After forming the sealing layer 600, a top surface of the sealing layer 600 is polished and the top surface of the post electrode 520 is exposed from the sealing resin 600.

Figure 14:
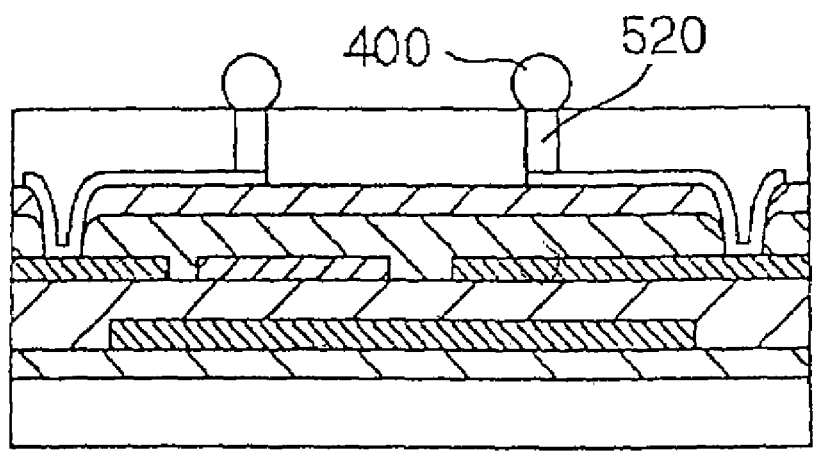
Figure 15:
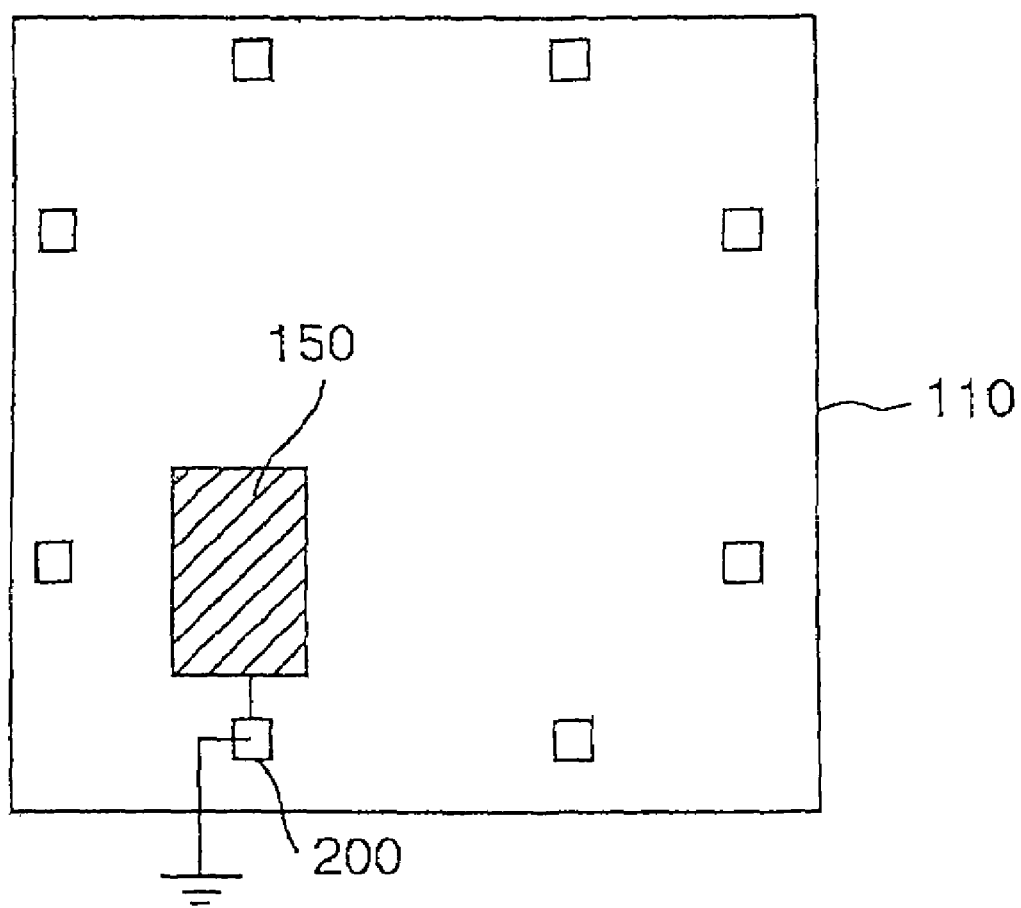
FIG. 15 is a plane view showing a semiconductor device for use in explaining the fabricating steps of the fourth embodiment of the present invention.

Next, the external terminals 400 such as solder are formed on the top surface of the post electrodes 520 as shown in FIG. 14.

Accordingly, the metal member 150 and the wirings 140b are formed simultaneously, and the metal member 150 can be formed without additional process steps.

Fifth Preferred Embodiment

Figure 16:
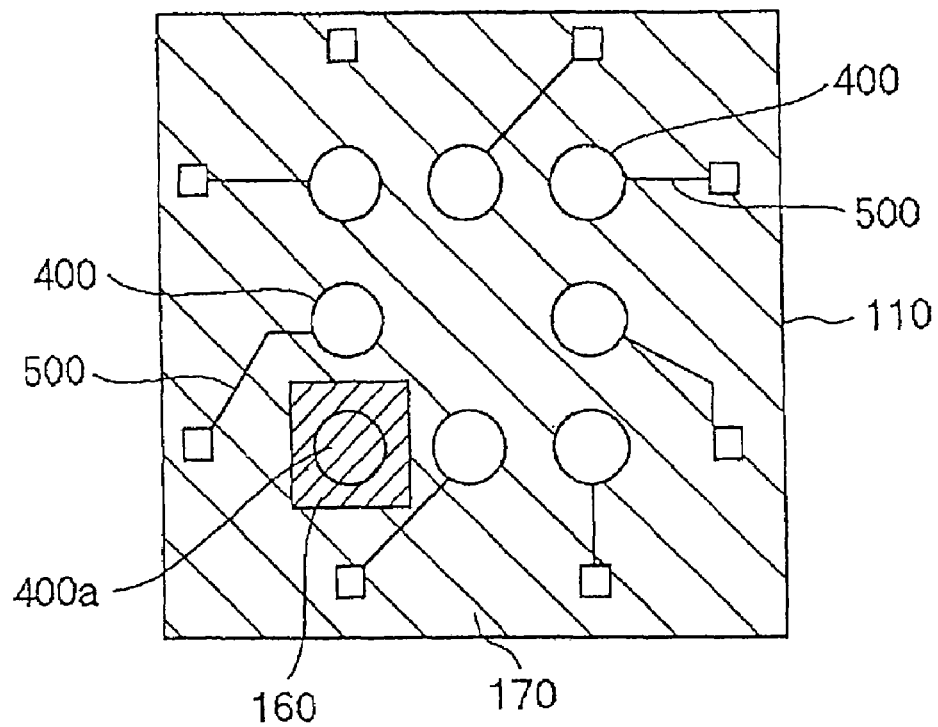
FIG. 16 is a plane view showing a semiconductor device of a fifth embodiment of the present invention.

FIG. 16 is a plane view showing a semiconductor device of a fifth embodiment of the present invention.

The semiconductor chip 100 includes a first area 160 in which an analog circuit is formed and a second area 170 in which the analog circuit is not formed. The external terminals 400 are formed on the each of the first area 160 and the second area 170. All of the redistribution wirings 500 are formed on the second area 170. That is, the external terminal 400a which is formed on the first area 160 is not connected to the redistribution wirings 500 and the redistribution wiring 500 is not formed on the first area 160. The external terminal 400a is not electrically connected to the semiconductor chip. Therefore, no signal is applied to the external terminal 400a. That is, there is no noise source on the first area 160.

Accordingly, since there is no noise source on the first area 160, the affect of noise in the analog circuit is reduced.

The external terminal 400a itself is not necessarily for reducing noise. However, if the external terminal 400a is not formed, the external terminals 400 are not evenly arranged on the semiconductor chip 100. As a result, when the semiconductor device is mounted on an external substrate, a balance of the semiconductor device become unstable.

According to the embodiment, the same shaped external terminals 400 are arranged evenly, and the semiconductor device can be mounted on the external substrate stably.

Sixth Preferred Embodiment

Figure 17:
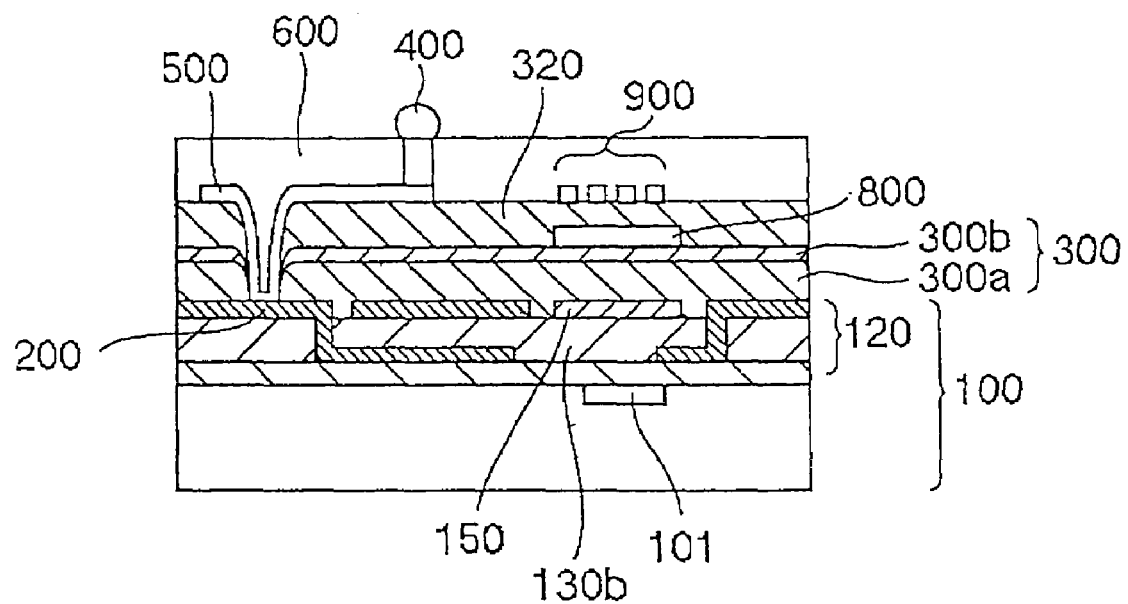
FIG. 17 is a cross-sectional view showing a semiconductor device of a sixth embodiment of the present invention.
Figure 18:
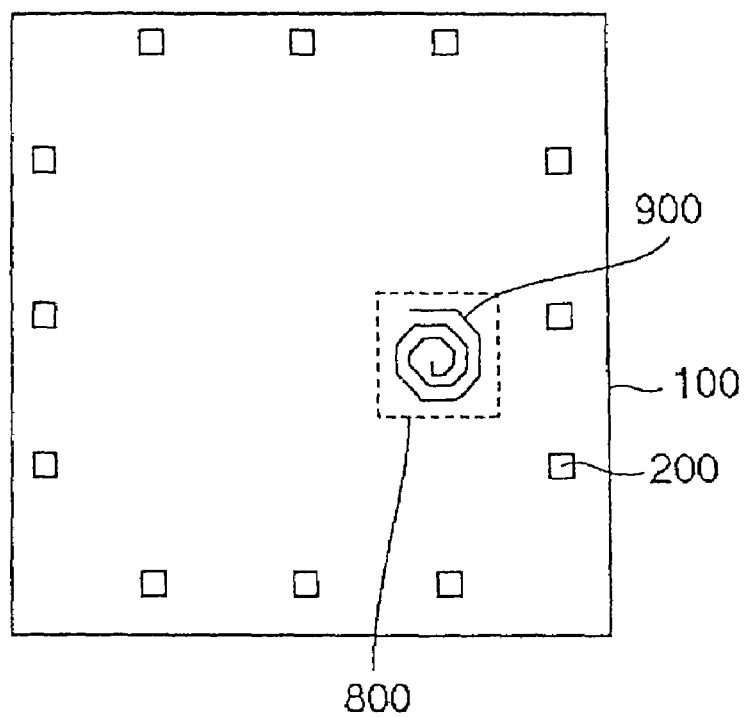
FIG. 18 is a plane view showing a semiconductor device of the sixth embodiment of the present invention.

FIG. 17 is a cross-sectional view showing a semiconductor device of a sixth embodiment of the present invention. FIG. 18 is a plane view showing a semiconductor device of the sixth embodiment of the present invention.

The semiconductor device in this embodiment includes the insulating layer 130 formed on the semiconductor chip 100, a magnetic material such as Fe, Ni or Co formed on the insulating layer 130 and an insulating layer 320 such as polyimide. The insulating layer 320 is formed with opening aligned over the top surface of the electrode pads 200.

Further, the inductor 900 and the external terminal 400 are formed on the insulating layer 320.

The magnetic material 800 is arranged under the inductor 900. That is, an area that the inductor 900 is formed is included in an area that the magnetic material 800 is formed in a top view. The magnetic material 800 shields noise which is generated in the inductor 900. For protecting the electric circuit from the noise, the entire area of the inductor may be included in the magnetic material formation area.

Further, if the capacitor 101 is formed on the semiconductor device, the metal member 150 is formed on the insulating layer 130b. The metal member 150 is arranged above the capacitor 101 and is applied with the ground voltage.

The magnetic material functions to change a direction of a magnetic field. Therefore, the magnetic field which is generated in the inductor 900 is bent to a lateral direction. As a result, the possibility that noise which reach the electric circuit is reduced.

The telecommunication device is operated by high frequency. Therefore, a communication characteristic of the semiconductor device used in the telecommunication device is easily changed by noise. The semiconductor device in the embodiment is suitable for using such the telecommunication device.

Seventh Preferred Embodiment

Figure 19:
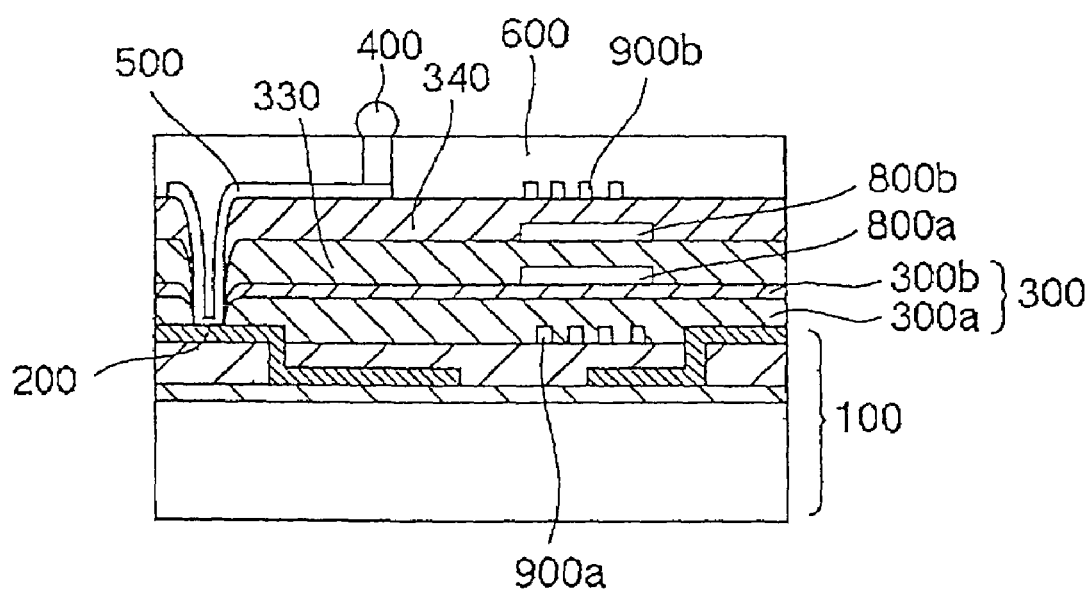
FIG. 19 is a cross-sectional view showing a semiconductor device of a seventh embodiment of the present invention.

FIG. 19 is a cross-sectional view showing a semiconductor device of a seventh embodiment of the present invention.

The semiconductor device has an inductor 900a formed on the semiconductor chip 100, the insulating layer 300 formed on the semiconductor chip 100 and the inductor 900a and a magnetic material 800a formed on the insulating layer 300. An insulating layer 330 is formed on the insulating layer 300 and the magnetic material 800a and a magnetic material 800b are formed on the insulating layer 330. An insulating layer 340 is formed on the insulating layer 330 and the magnetic material 800b. The redistribution wirings 500 and an inductor 900b are formed on the insulating layer 340.

The insulating layer 340 and the insulating layer 330 are formed of polyimide. The magnetic material 800a and the magnetic material 800b are formed of Fe(iron), Ni(nickel) or Co(cobalt).

The magnetic material 800b is arranged under the inductor 900b and the inductor 900a is arranged under the magnetic material 800a.

The magnetic material functions to change a direction of a magnetic field. A magnetic field which is generated in the inductor 900a is changed to a lateral direction by the magnetic material 800a and a magnetic field which is generated in the inductor 900b is changed to a lateral direction by the magnetic material 800b.

Each magnetic field generated in each inductor 900a and 900b is changed by respective magnetic materials 800a and 800b. As a result, each magnetic field generated in each inductor 900a and 900b do not affect each other. Therefore, the inductor 900a and the inductor 900b can be arranged so that both inductors face each other.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device comprising:
a semiconductor chip which includes a circuit element, a first wiring and an electrode pad, wherein the circuit element includes an electronic element, and wherein the first wiring is electrically connected between the circuit element to the electrode pad;
an insulating layer formed on the semiconductor chip, wherein the insulating layer has an opening which is aligned over the electrode pad;
an external terminal formed on the insulating layer;
a second wiring formed on the insulating layer, wherein the second wiring electrically connects the electrode pad to the external terminal via the opening; and
a shielding film located in a same plane as the first wiring and interposed between the electronic element and the second wiring,
wherein the electronic element includes a capacitor, and wherein the shielding film completely overlaps the capacitor.

2. The semiconductor device according to claim 1, wherein the circuit element comprises a voltage controlled oscillator which includes the capacitor.

3. The semiconductor device according to claim 2, wherein the voltage controlled oscillator generates a signal having a frequency of at least 300 MHz.

4. A semiconductor device comprising:
a semiconductor chip which includes a circuit element, a first wiring and an electrode pad, wherein the circuit element includes an electronic element, and wherein the first wiring is electrically connected between the circuit element to the electrode pad;
an insulating layer formed on the semiconductor chip, wherein the insulating layer has an opening which is aligned over the electrode pad;
an external terminal formed on the insulating layer;
a second wiring formed on the insulating layer, wherein the second wiring electrically connects the electrode pad to the external terminal via the opening; and
a shielding film located in a same plane as the first wiring and interposed between the electronic element and the second wiring,
wherein the shielding film is a metal and is connected to a ground voltage.

5. A semiconductor device composing:
a semiconductor chip which includes a circuit element, a first wiring and an electrode pad, wherein the circuit element includes an electronic element, and wherein the first wiring is electrically connected between the circuit element to the electrode pad;
an insulating layer formed on the semiconductor chip, wherein the insulating layer has an opening which is aligned over the electrode pad;
an external terminal formed on the insulating layer;
a second wiring formed on the insulating layer, wherein the second wiring electrically connects the electrode pad to the external terminal via the opening; and
a shielding film located in a same plane as the first wiring and interposed between the electronic element and the second wiring, wherein the electrode pad is located in a peripheral region of the semiconductor device, and wherein the external terminal is located in a central region of the semiconductor device.

6. A semiconductor device comprising:
   a semiconductor chip;
   a first inductor formed on the semiconductor chip;
   a first insulating layer formed on the semiconductor chip and the first inductor;
   a first shielding film formed on the first insulating layer;
   a second insulating layer formed on the first insulating layer and the first shielding film;
   a second shielding film formed on the second insulating layer;
   a third insulating layer formed on the second insulating layer and the second shielding film; and
   a second inductor and an external terminal formed on the third insulating layer;
   wherein the first inductor is located under the first shielding film and the second shielding film is located under the second inductor.

7. The semiconductor device according to claim 6, wherein the first shielding film and the second shielding film are a magnetic material.

* * * * *